United States Patent
Schuster et al.

(10) Patent No.: US 11,018,074 B2
(45) Date of Patent: May 25, 2021

(54) ENERGY SUPPLY

(71) Applicant: WITTENSTEIN SE, Igersheim (DE)

(72) Inventors: Jürgen Schuster, Weikersheim (DE); Rolf Hoffmann, Creglingen (DE)

(73) Assignee: Wittenstein SE, Igersheim (DE)

( * ) Notice: Subject to any disclaimer, the term of this patent is extended or adjusted under 35 U.S.C. 154(b) by 92 days.

(21) Appl. No.: 16/367,364

(22) Filed: Mar. 28, 2019

(65) Prior Publication Data
US 2019/0304868 A1   Oct. 3, 2019

(30) Foreign Application Priority Data

Mar. 29, 2018  (DE) .......................... 102018107584.7

(51) Int. Cl.
H01L 23/38 (2006.01)
H01L 35/32 (2006.01)
H01L 33/64 (2010.01)

(52) U.S. Cl.
CPC ............ *H01L 23/38* (2013.01); *H01L 33/645* (2013.01); *H01L 35/32* (2013.01)

(58) Field of Classification Search
CPC ....... H01L 23/38; H01L 35/32; H01L 33/645; H02N 11/002
USPC ................... 318/400.08, 400.04, 400.01, 700
See application file for complete search history.

(56) References Cited

U.S. PATENT DOCUMENTS

| 7,064,804 B2 * | 6/2006 | Emoto | G03F 7/70525 |
| | | | 355/30 |
| 7,282,874 B2 * | 10/2007 | Shibata | H02K 41/03 |
| | | | 108/137 |
| 9,719,702 B2 * | 8/2017 | Murata | H01M 10/6572 |

FOREIGN PATENT DOCUMENTS

| DE | 102008021697 A1 | 11/2009 |
| DE | 102013011300 A1 | 1/2015 |
| DE | 102008046202 B4 | 5/2015 |
| DE | 102014002628 A1 | 8/2015 |
| DE | 102014112826 A1 | 3/2016 |
| WO | 2015128050 A1 | 9/2015 |

* cited by examiner

Primary Examiner — David Luo
(74) Attorney, Agent, or Firm — Bachman & LaPointe, PC

(57) ABSTRACT

Apparatus for providing electrical energy, in particular for providing electrical energy from a heat flow originating from an electric motor, including a first component part, a second component part, wherein a Peltier element is arranged between the first component part and the second component part, said Peltier element being at least partially surrounded by a layer of insulation provided between the first component part and the second component part, with the result that the Peltier element forms a thermal bridge between the first and the second component parts, and wherein the first and the second component parts are selected from the following group: gear mechanism, motor and adapter plate.

10 Claims, 4 Drawing Sheets

ENERGY SUPPLY

FIELD OF THE INVENTION

The invention relates to an apparatus for providing electrical energy and to a thereof.

PRIOR ART

Systems which utilize a temperature difference between a component part which heats up during operation and the surrounding environment to provide electrical energy for consumers are known from the prior art. Such energy production can take place by means of Peltier elements.

The energy produced in this way is typically used for applications close to the component part which heats up, for example a motor.

However, the systems known from the prior art sometimes do not have a very wide variety of usage or have only a low power or require additional cooling elements and therefore additional installation space for producing a sufficient temperature drop.

WO 2015/128050 A discloses a possibility of supplying power to an electronic circuit from a Peltier element. However, the variant described in this document is restricted in respect of the variability of use.

DISCLOSURE OF THE INVENTION

The object of the invention consists in specifying apparatuses and methods for providing electrical energy which are improved in comparison with the prior art; in particular a sufficient supply of energy is intended to be achieved reliably as far as possible with variable installation possibilities and without any additional requirements in respect of installation space.

The object is achieved by an apparatus as disclosed herein and a further apparatus and a use also as disclosed herein.

A first aspect of the invention relates to an apparatus for providing electrical energy, in particular for providing electrical energy from a heat flow originating from an electric motor, comprising a first component part, a second component part, wherein a Peltier element is arranged between the first component part and the second component part, said Peltier element being at least partially surrounded by a layer of insulation provided between the first component part and the second component part, with the result that the Peltier element forms a thermal bridge between the first and the second component parts, and wherein the first and the second component parts are selected from the following group: gear mechanism, motor and adapter plate.

A further aspect of the invention relates to an apparatus for providing electrical energy, in particular for providing electrical energy from a heat flow originating from an electric motor, comprising a layer of insulation in the form of an insulating plate intended for arrangement between two component parts of a drive, wherein the insulating plate has a through-opening for a shaft, and a Peltier element, which is at least partially bordered by the insulating plate.

A further aspect of the invention relates to a use of a Peltier element arranged between a motor and a gear mechanism for providing electrical energy, in particular for providing electrical energy from a heat flow originating from the electric motor.

During normal operation of a drivetrain, a continuous heat flow flows from the motor via the gear mechanism in the direction of the machine bed, as a result of which a slight temperature gradient is formed in the drivetrain. By installing a layer of insulation with a lower thermal conductivity than the surrounding metal between the motor and the gear mechanism with a Peltier element installed in the layer of insulation, which Peltier element typically has a higher thermal conductivity than the layer of insulation, the heat flow is channeled substantially through the Peltier element, wherein a sufficiently high temperature difference results between the two sides of the Peltier element. Owing to the Seebeck effect, an electrical voltage is generated in the Peltier element which can be used for supplying power to sensors or other electronics such as, for example, a microcontroller or a radio module for data transmission which can be provided in an adapter plate as well, for example.

In typical embodiments, the Peltier element is at least partially bordered by the layer of insulation, which is typically in the form of an insulating plate. This provides a particularly compact design.

In typical embodiments, electrical energy is provided from a heat flow originating from an electric motor. Motors heat up during operation and transfer this heat to the environment in various ways or by various heat flows. Preferably, energy from a heat flow is used in which the motor transfers heat to another component part of a drivetrain containing the motor by heat conduction. In this case, the Peltier element does not necessarily need to be arranged so as to be directly adjoining the motor. In further embodiments, a heat flow is used which originates from a gear mechanism or in which a gear mechanism represents a heat sink.

In embodiments, the Peltier element is arranged between an adapter plate and a motor or a gear mechanism. The arrangement between such component parts provides the possibility of using a reliably occurring heat flow directly. Adapter plates are generally used in order to connect motors to gear mechanisms, for example in order to provide a possibility of using different motors with one type of gear mechanism construction.

Typically, the Peltier element is in direct touching contact with the component parts between which the heat flow occurs. In further embodiments, a layer with typically good thermal conductivity, for example a fastening plate, a heat-conducting layer, a heat-conducting film, a heat-conducting paste or a layer of electrical insulation, is arranged between at least one of the two component parts and the Peltier element.

Typically, a Peltier element is arranged between the first component part and the second component part, said Peltier element being at least partially surrounded by a layer of insulation, which is likewise provided between the first component part and the second component part, with the result that the Peltier element forms the thermal bridge between the first and the second component parts. In so far as a "layer of insulation" is referred to herein without any more detailed specification, this is a layer of thermal insulation, and similarly the words "conducting", "insulating" or the like relate to heat transfers, where not specified otherwise.

Typically, the first and the second component parts are selected from the following group: gear mechanism, motor and adapter plate, wherein the first and the second component parts are typically different. In typical embodiments, the second component part is an adapter plate arranged between a motor and a gear mechanism.

The layer of insulation typically comprises a material with a lower thermal conductivity than the material of a housing of the first component part or a housing of the second component part. The layer of insulation may have an air gap or an insulating plate or combinations thereof.

Typical insulating plates consist of or comprise a plastic, Bakelite, ceramic, stainless steel or combinations thereof. Typical insulating plates of embodiments comprise a through-opening for a shaft, in particular an output shaft of the motor.

Typically, the layer of insulation on average or the material of the layer of insulation has a thermal conductivity of at most 25 W/(m*K), at most 15 W/(m*K) or at most 5 W/(m*K) or at most 1 W/(mK). Such low values can be achieved, for example, using plastic. In this way, it is ensured that the majority of the heat flow between the component parts flows through the Peltier element.

In typical embodiments, structural elements, in particular supports or spacer sleeves, are provided between the first component part and the second component part. Supports are also understood to mean bolts, screws or similar elements. Structural elements provide a connection between the component parts which can be subjected to loads, for example in order to absorb torques or other loads. Owing to the limited area of the structural elements, the heat transfer by the structural elements is not damaging to the function of the Peltier element.

Typical layers of insulation of embodiments comprise cavities, for example the layer of insulation can be in the form of a honeycomb structure or can be formed with cylindrical cavities or can be foamed.

Typical embodiments comprise an energy store, for example a capacitor, a double-layer capacitor or a battery, which is connected to the Peltier element. Typical energy stores are dimensioned in such a way that, after a charge time of at most 1 minute, can maintain the operation of a connected consumer, for example a sensor, at least for 200 ms. Further energy stores can maintain operation for at least 24 h.

Typical systems of embodiments for detecting at least one measured variable of a gear mechanism comprise an apparatus in one of the embodiments described herein and at least one sensor for detecting the at least one measured variable, wherein the sensor is connected to the Peltier element for the purpose of supplying energy to the sensor. Measured variables can be monitored and detected reliably and flexibly using such systems.

A typical use of the invention relates to the use of a Peltier element arranged between a motor and a gear mechanism for providing electrical energy. Typically, the energy is used for operating a sensor for measuring a measured variable of the gear mechanism and a device for further-processing, transmitting or storing the values delivered by the sensor. Examples of measured variables may be, for example, oil temperature, vibration, deformation or housing temperature. The Peltier element is typically used for providing electrical energy from a heat flow originating from the electric motor or from a heat flow flowing in the direction of the motor.

In embodiments comprising a motor having cooling, the heat flow can also take place in the direction of the motor, for example for dissipating heat away from the gear mechanism towards the cooled motor. In the case of such embodiments as well, the invention can be used expediently and profitably.

In embodiments, the layer of insulation is designed to be pressure-resistant. When using structural elements such as, for example, spacer sleeves, in embodiments the layer of insulation can also otherwise consist of air, at least for the most part or else completely.

The solution with a plastic plate as layer of insulation provides the advantage in comparison with other solutions that it is easy to manufacture and fit. As a result, the total construction is inexpensive. In comparison with the solution using spacer sleeves and air as insulation, the interior of the adapter plate is sealed off from the exterior if the layer of insulation at least partially or completely borders the Peltier element. Therefore, it is not possible for any contamination to enter the interior of the adapter plate.

The solution according to the invention does not require any built-in components outside the contour of known drives; in particular no interfering contours are produced. Therefore, it can be installed wherever the drive has also been installed without a Peltier element. At the same time, it is independent of the environmental conditions, for example the ambient temperature outside the gear mechanism, since it only uses the heat flow between the motor and the gear mechanism.

BRIEF DESCRIPTION OF THE DRAWINGS

Typical exemplary embodiments are shown in the figures, in which.

DESCRIPTION OF EXEMPLARY EMBODIMENTS

Typical exemplary embodiments will be described below, wherein sometimes the same reference symbols are used for identical or similar parts, sometimes even for a plurality of different embodiments. In principle, the application is not restricted to the different embodiments, but rather the scope is defined by the claims. Sometimes, individual parts are explained purely in connection with one figure and if these parts are illustrated in further figures they are not necessarily described once again.

Figure 1:
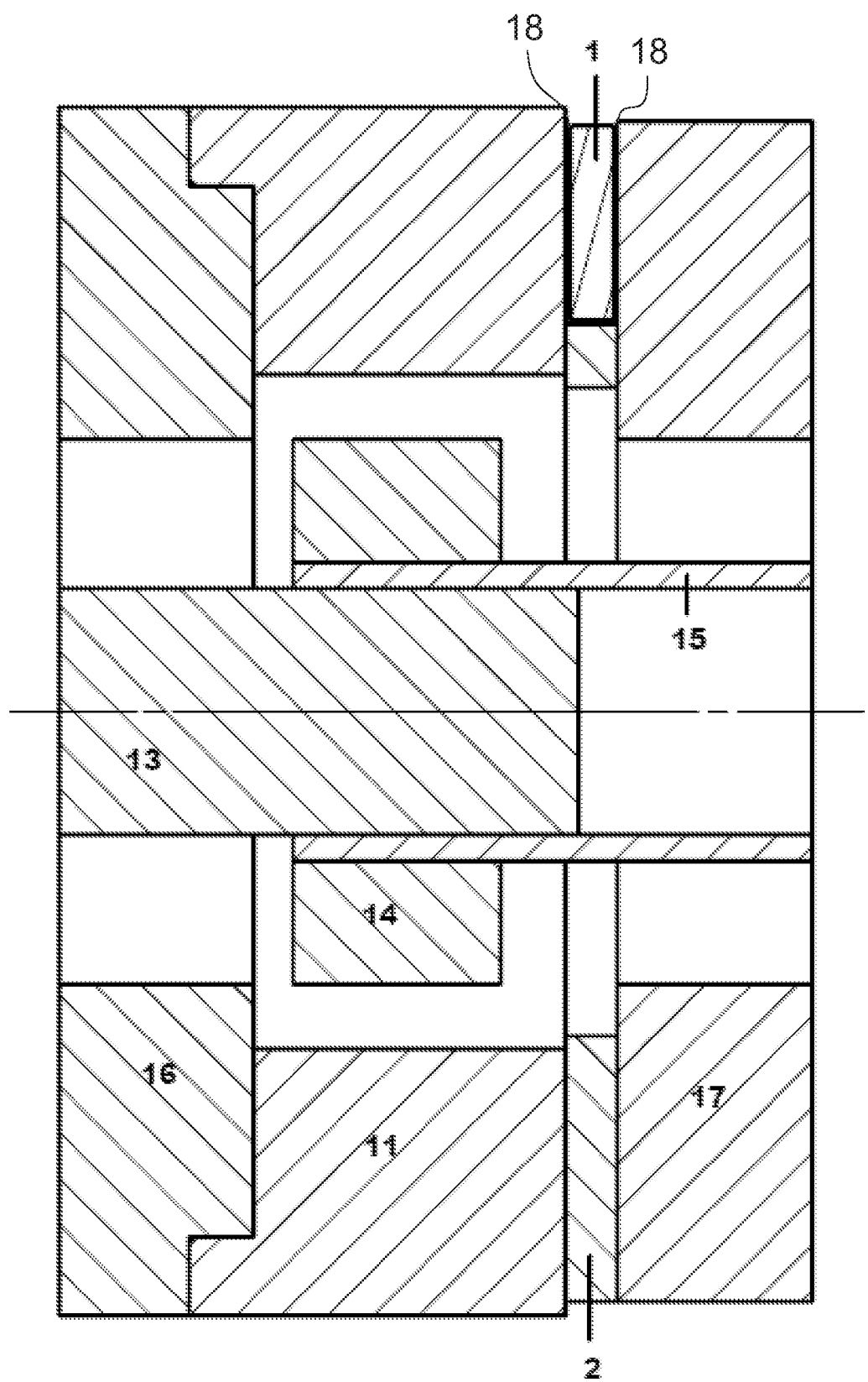
FIG. 1 shows a schematic sectional view of an exemplary embodiment of an apparatus.

FIG. 1 shows an exemplary embodiment of a typical embodiment of the invention in a cross-sectional view. The embodiment shown in FIG. 1 comprises a gear mechanism 17 (for example SP100 gear mechanism by WITTENSTEIN SE). A 3.7 mm-thick layer of insulation 2 consisting of Bakelite (plate PF 1110) with the same outer diameter as the drive flange of the gear mechanism 17 has been installed between an adapter plate 11 and the drive flange of the gear mechanism 17.

The layer of insulation has a thermal conductivity of 0.2 W/(mK). The motor 16 and the gear mechanism 17 each have a housing consisting of steel with a thermal conductivity of approximately 40 to 60 W/(mK). The adapter plate 11 is produced from aluminum with a thermal conductivity of approximately 200 W/(mK).

FIG. 1 furthermore shows a motor 16 which heats up during operation. The motor has an output shaft or shaft 13, on which a receptacle 15 is fastened by means of a hub or clamping hub or clamping ring 14. The torque of the motor is fed to the gear mechanism 17 via the receptacle 15.

The layer of insulation 2 has a centrally arranged bushing, through which the shaft 13 and the receptacle 15 are guided.

The layer of insulation 2 has an inner diameter which represents an intermediate size between the inner dimensions of the adapter plate 11 and the inner dimensions of the drive flange of the gear mechanism 17. A Peltier element 1 which is 15×15 mm in size and has a thickness of 3.3 mm is arranged in a cutout provided in the outer diameter of the layer of insulation 2.

Two elastic heat-conducting films 18 on both sides of the Peltier element 1 ensure good thermal contact between the Peltier element 1 and the adapter plate and between the Peltier element 1 and the drive flange of the gear mechanism 17. The heat-conducting films 18 are therefore arranged in each case between the Peltier element 1 and the adapter plate 11 and the gear mechanism 17.

Owing to heat-conducting films on both sides of the Peltier element, the risk of mechanical damage to the Peltier element during contact-pressure is reduced. The heat-conducting films distribute the contact-pressure which is produced when the gear mechanism and the adapter plate are fitted on the motor substantially uniformly over the entire Peltier element.

In the case of typical heating of the adapter plate, for example by a motor and the function of the gear mechanism as heat sink, a temperature difference of several kelvin is formed between the adapter plate and the drive flange of the gear mechanism, as a result of which an electrical voltage is produced between the contacts of the Peltier element (for example 100 mV). Therefore, energy can be supplied by a voltage transformer to electronics in the case of an average electrical power of less than approximately 100 mW, i.e. for example a sensor and a data detection or data transmission unit.

In the embodiment in FIG. 1, an energy store (not shown in FIG. 1) is connected to the Peltier element 1 in order to ensure a supply of energy to a sensor (not shown in FIG. 1). The sensor is designed to measure a temperature of the gear mechanism and to transmit this wirelessly to a receiver. The energy required for this purpose is provided to the sensor by the Peltier element 1.

Figure 2:
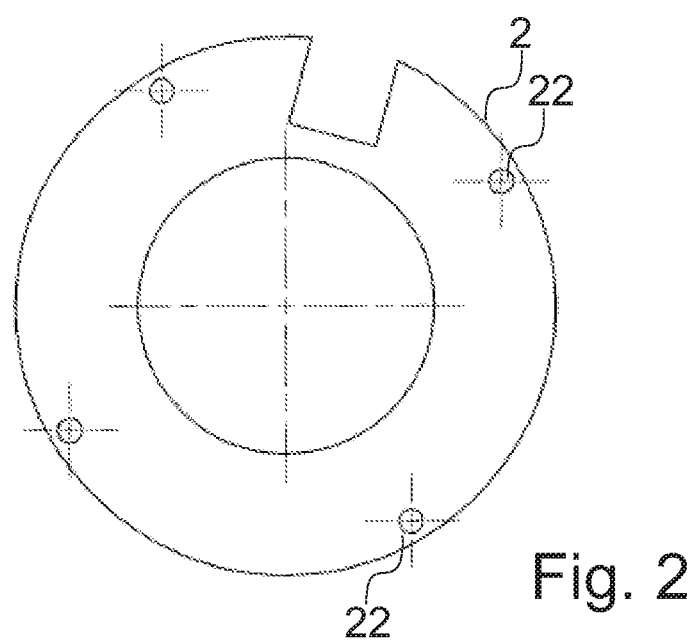
FIG. 2 shows a typical embodiment of a layer of insulation in a schematic plan view.

FIG. 2 shows a typical embodiment of a layer of insulation 2 in a schematic plan view. The layer of insulation 2 has a central circular bushing for a shaft 13 and a receptacle 15. Four further bores 22 specify the pattern of holes for fastening to the gear mechanism.

Furthermore, the layer of insulation 2 has a cutout at the outer rim, said cutout substantially corresponding to the size of a Peltier element to be arranged there (not shown in FIG. 2; see FIG. 1). The compressive stresses between the adapter plate and the motor or between the adapter plate and the gear mechanism are absorbed by the layer of insulation 2 consisting of plastic.

In further embodiments, the compressive stresses in the layer of insulation are absorbed by spacer sleeves, with the result that an insulating plate consisting of plastic or other materials can be dispensed with, if appropriate. Owing to the small cross section of a spacer sleeve and of the insulation through air in the remaining region, the heat flow occurring through the spacer sleeves is little enough for it be possible for sufficient heat to still be converted into electrical energy via the Peltier element.

Figure 3:
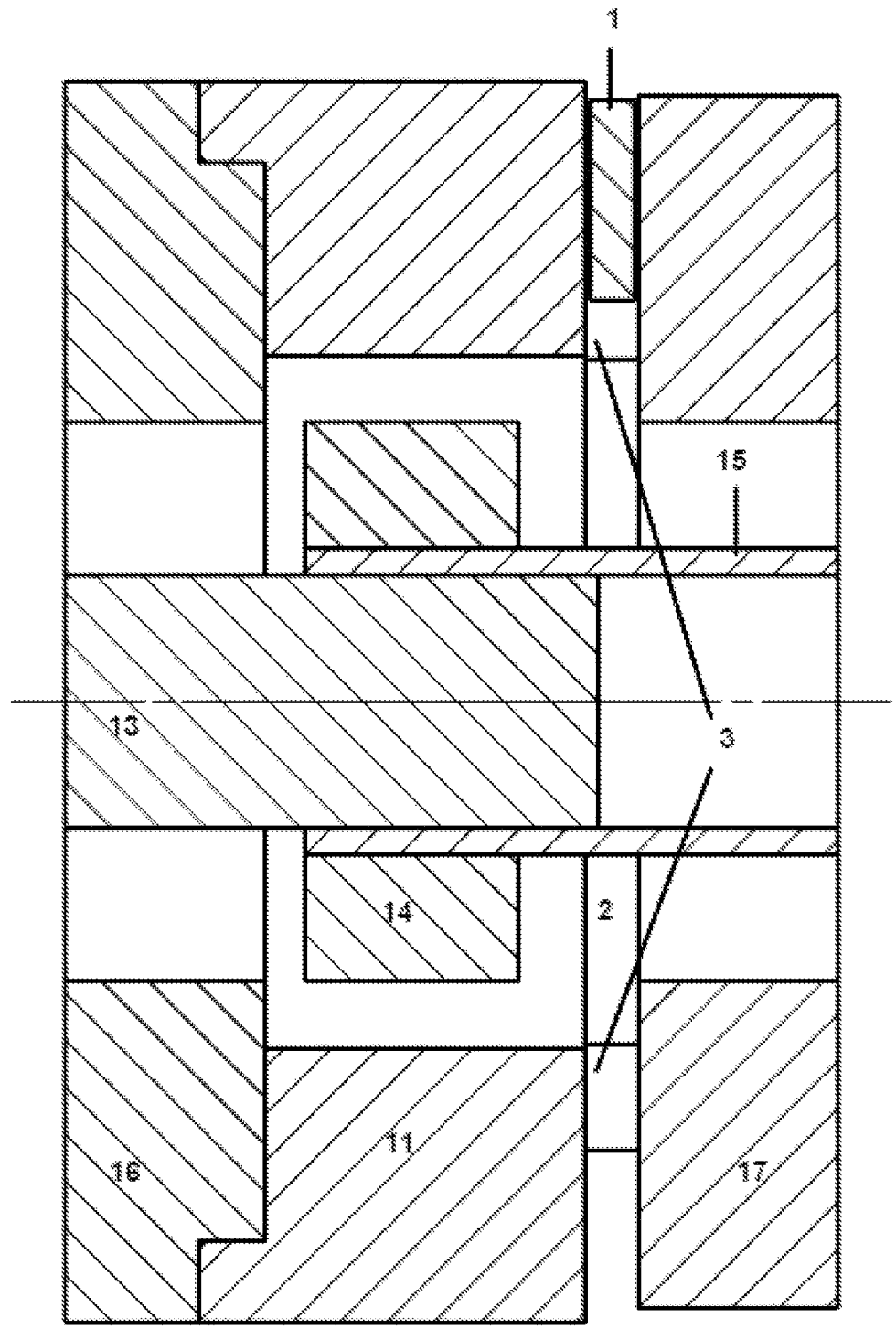
FIG. 3 shows a further typical embodiment of the apparatus in a schematic sectional view.
Figure 4:
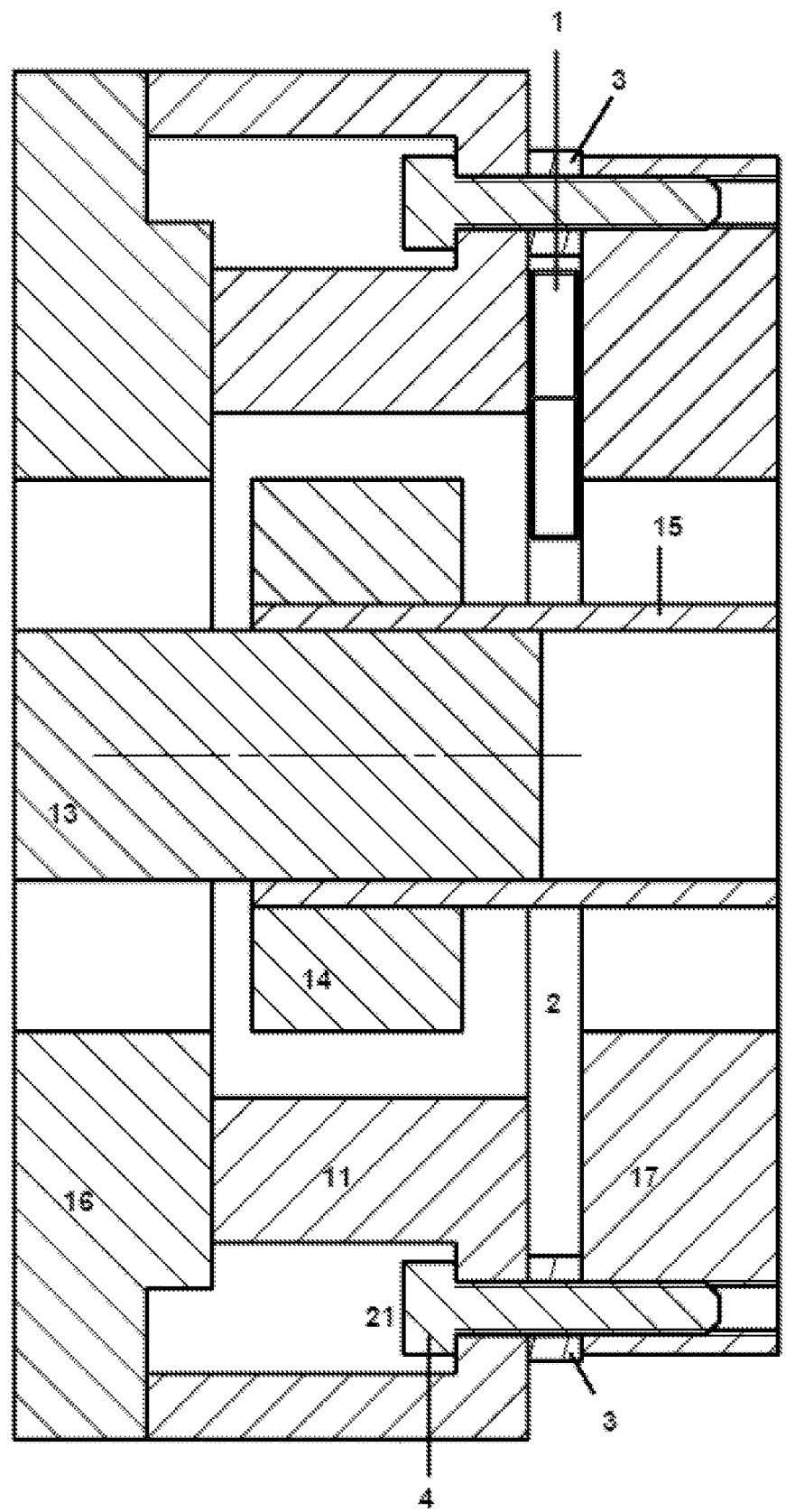
FIG. 4 shows the embodiment from FIG. 3 in a schematic sectional view with the section being rotated with respect to the section in FIG. 3.

FIG. 3 shows a further typical embodiment of the apparatus in a schematic sectional view, and FIG. 4 shows the embodiment from FIG. 3 in a schematic sectional view, with the section being rotated with respect to the section in FIG. 3.

FIG. 3 and FIG. 4 will be explained together. Features which have already been explained in connection with FIG. 1 and are present in similar or identical form in the exemplary embodiment in FIG. 3 and FIG. 4 are sometimes not described again.

FIG. 3 and FIG. 4 show schematically, in two cross sections, an embodiment which has spacer sleeves 3 in order to provide a layer of insulation which consists substantially of air between an adapter plate 11 and a gear mechanism 17.

The adapter plate 11 and the gear mechanism 17 are held together by means of a plurality of fastening screws 4 (only two fasting screws 4 are shown in FIG. 3), and a compressive force is built up on the spacer sleeves 3 so that a stable connection between the adapter plate 11 and the gear mechanism 17 is produced.

Only two spacer sleeves 3 are shown in the schematic cross section in FIG. 4. The embodiment in FIG. 3 and FIG. 4, however, has additional spacer sleeves and fastening screws 4 over the circumference.

Some of the heat transported from a motor 16 via the adapter plate 11 to the gear mechanism 17 can be used by the Peltier element 1 arranged between the adapter plate 11 and the gear mechanism 17.

The invention is not restricted to the above-described exemplary embodiments; for example, a second Peltier element can also be provided or additional electrical energy is made available using other sources. The scope of the invention is instead defined by the claims.

The invention claimed is:

1. Apparatus for providing electrical energy, in particular for providing electrical energy from a heat flow originating from an electric motor, comprising
   a first component part,
   a second component part,
   wherein a Peltier element is arranged between the first component part and the second component part, said Peltier element being at least partially surrounded by a layer of insulation provided between the first component part and the second component part, such that the Peltier element forms a thermal bridge between the first and the second component parts, and
   wherein the first and the second component parts are selected from the following group: gear mechanism, motor (16) and adapter plate.

2. Apparatus according to claim 1, wherein the first and the second component parts are different.

3. Apparatus according to claim 1, wherein the second component part is an adapter plate arranged between a motor and a gear mechanism.

4. Apparatus according to claim 1, wherein the layer of insulation has a material with a lower thermal conductivity than the material of at least one of a housing of the first component part and a housing of the second component part.

5. Apparatus according to claim 1, wherein the layer of insulation has a thermal conductivity of at most 25 W/(m*K).

6. Apparatus according to claim 1, wherein supports and/or spacer sleeves are provided between the first component part and the second component part.

7. Apparatus according to claim 1, wherein a heat-conducting film and/or a layer of heat-conducting paste is provided in each case between the first component part and/or the second component part, on the one hand, and the Peltier element, on the other hand.

8. Apparatus according to claim 1, wherein the layer of insulation comprises cavities.

9. Apparatus according to claim 1, further comprising an energy store connected to the Peltier element.

10. System for detecting at least one measured variable of a gear mechanism comprising an apparatus according to claim 1 and at least one sensor for detecting the at least one measured variable, wherein the sensor is connected to the Peltier element for the purpose of supplying energy to the sensor.

* * * * *